United States Patent [19]
Olivo et al.

[11] Patent Number: 5,586,077
[45] Date of Patent: Dec. 17, 1996

[54] CIRCUIT DEVICE AND CORRESPONDING METHOD FOR RESETTING NON-VOLATILE AND ELECTRICALLY PROGRAMMABLE MEMORY DEVICES

[75] Inventors: Marco Olivo, Bergamo; Silvia Padoan, Rimini, both of Italy

[73] Assignee: SGS-Thomson Microelectronics S.r.l., Agrate Brianza, Italy

[21] Appl. No.: 366,212

[22] Filed: Dec. 29, 1994

[30] Foreign Application Priority Data

Dec. 31, 1993 [EP] European Pat. Off. ............. 93830540

[51] Int. Cl.$^6$ ...................................................... G11C 7/00
[52] U.S. Cl. ........................ 365/226; 365/195; 365/228; 365/189.07
[58] Field of Search ............................... 365/229, 189.01, 365/226, 195, 228, 189.07; 364/483; 371/22.1

[56] References Cited

U.S. PATENT DOCUMENTS 4,975,883  12/1990  Baker et al. ............................ 365/226
5,008,566   4/1991  Hashimoto ........................... 307/296.8
5,016,222   5/1991  Hashimoto ............................. 365/226
5,019,996   5/1991  Lee ......................................... 364/483
5,426,616   6/1995  Kajigaya et al. ....................... 365/229
5,450,417   9/1995  Truong .................................. 371/22.1

FOREIGN PATENT DOCUMENTS 2241319   9/1990   Japan ................................. H02H 3/24

*Primary Examiner*—Viet Q. Nguyen
*Attorney, Agent, or Firm*—David V. Carlson; Bryan A. Santarelli; Seed and Berry LLP

[57] ABSTRACT

A method for generating a reset signal in an electrically programmable non-volatile storage device of a type which comprises a matrix of memory cells and a control logic portion being supplied a supply voltage and a programming voltage, and a threshold detection circuit adapted to detect a decrease in the supply voltage, provides for the signal applied to the control logic to be obtained as a change-over function between the output signal from the threshold detector and a reset signal generated during the power-on transient of the device.

14 Claims, 2 Drawing Sheets

PLOT OF SIGNAL LowVcc

PLOT OF SIGNAL POR

CIRCUIT DEVICE AND CORRESPONDING METHOD FOR RESETTING NON-VOLATILE AND ELECTRICALLY PROGRAMMABLE MEMORY DEVICES

FIELD OF THE INVENTION

This invention relates to a circuit device and associated method for generating a reset signal in storage devices.

BACKGROUND OF THE INVENTION

As is known, many of the storage devices currently available commercially provide for the memory internal logic control circuitry to be reset.

The reset signal is normally generated within the integrated storage circuit, and the activation of this signal is responsive to a decrease in the circuit supply voltage Vcc.

This manner of operation is of special importance to devices being supplied a programming voltage Vpp from outside which usually has a relatively high value, in excess of 10 volts. The most dangerous situation likely to be encountered by such devices is, in fact, a decrease in the supply voltage Vcc while the value of the programming voltage Vpp is held at a high. Under this condition, lacking an ability to control the logic circuitry operation, erasure or incorrect programming of the storage elements may occur.

To avoid such problems, currently available devices on the market are arranged to include threshold detection devices which are supplied the programming voltage Vpp and effective to detect a drop in the supply voltage Vcc below a predetermined minimum value. Such circuits activate the device resetting by disabling all the circuits connected to the relatively high programming voltage Vpp.

The operation of the detection circuits is only ensured, however, in the presence of a programming voltage Vpp which has a positive value above a predetermined minimum value.

An example of a detection circuit based on the above-outlined operation principles is to be found in U.S. Pat. No. 4,975,885, to "INTEL." The circuit described therein has an output which would signal a drop in the supply voltage Vcc below a threshold value of 3.7 volts, but only for higher values of the programming voltage than 4.5 volts.

However, the reset mode provided by the prior art circuits affords no control at the device power-on stage, i.e., as the supply voltage Vcc is brought from 0 up to a steady-state value.

This deficiency is quite serious because on turning on, and in the absence of the programming voltage Vpp, no reset signal would be generated. In this way, the initial state of the internal control logic remains undetermined.

To obviate this drawback, some devices provide for the storage reset signal to be driven from outside. For instance, the integrated storage circuit currently available commercially has a PWD (Deep Power Down) pin intended to minimize the circuit's power consumption. However, that PWD pin may also receive a reset signal activated by the user.

This is not an adequate solution, because it depends on, among other things, the device user's proper recollection, skill and technical circuit knowledge.

SUMMARY OF THE INVENTION

An object of this invention is to provide a uniquely simple circuit solution which allows the storage device to be reset automatically even during the power-on transient, thereby overcoming all the drawbacks with which the prior art approaches are beset. A preferred aspect of the present invention provides for obtaining a logical sum between a logic signal responsive to a decrease in the supply voltage Vcc, being only effective in the presence of a programming voltage Vpp above a predetermined value, and a signal generated by a provided circuit which follows the power-on transient.

The features and advantages of a circuit and a method according to the invention will be apparent from the following detailed description.

DETAILED DESCRIPTION OF THE INVENTION

Figure 1:
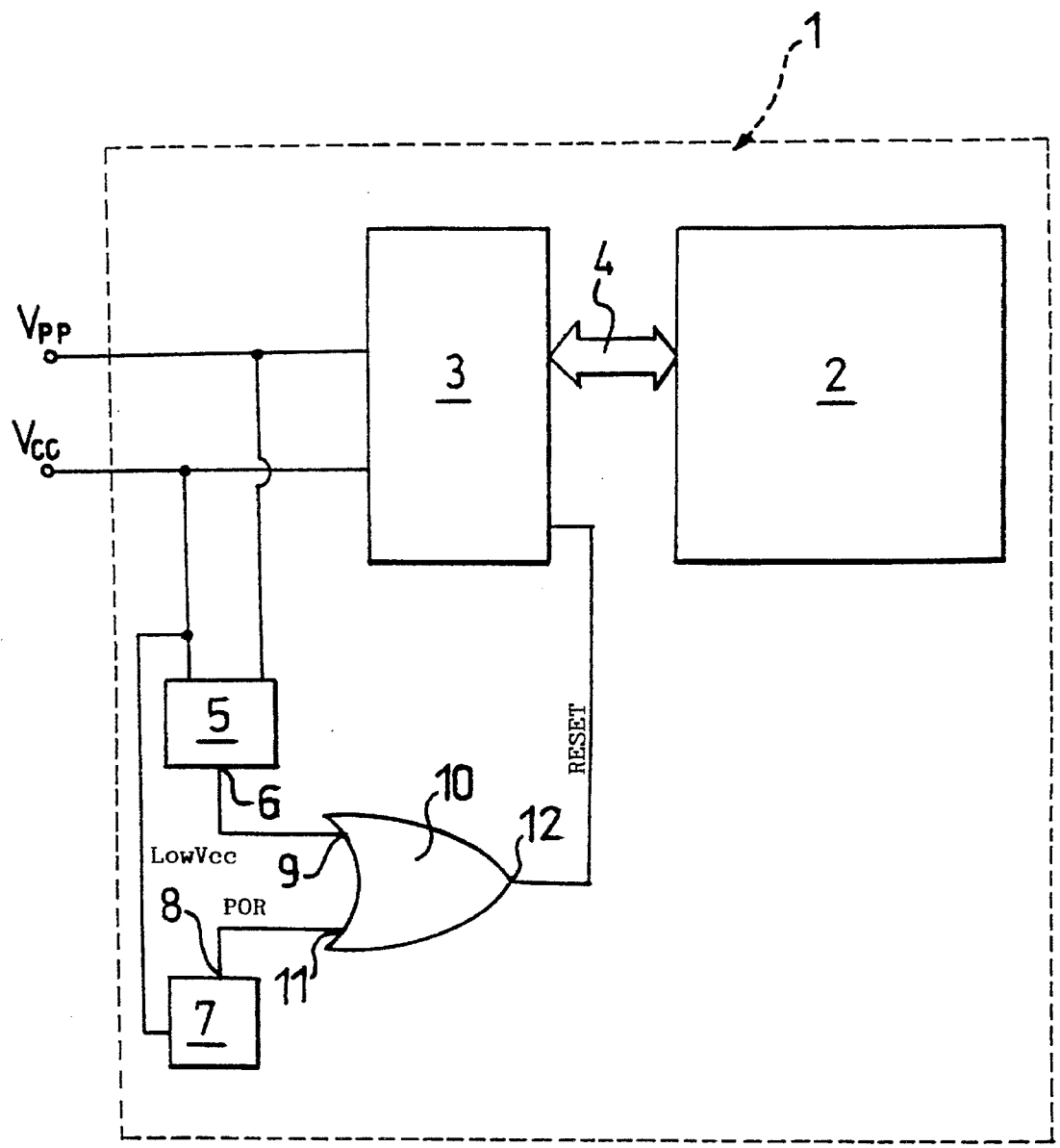
FIG. 1 illustrates a non-volatile storage device incorporating a reset signal generating circuit according to the invention.

FIG. 1 illustrates a non-volatile storage circuit that is integrated to a semiconductor and electrically programmable. The circuit 1 is in particular, but not limited thereto, a storage device of the "flash" EEPROM type. This circuit 1 comprises a memory matrix 2 and a logic control circuit portion 3, as well as electric connections of the bus type, between the matrix 2 and the control logic 3.

The circuit 1 is supplied by a supply voltage Vcc of about 5 V and by a programming voltage Vpp of about 12 V. These voltages are supplied to the storage circuit through respective input terminals or pins.

The circuit 1 further comprises a threshold detection circuit 5 connected between the supply voltage Vcc, the programming voltage Vpp, and a signal ground GND.

The circuit 5 has an output 6 at which a logic signal LowVcc having a "high" logic value will appear upon detection of a decrease in the supply voltage Vcc below a predetermined minimum value Vccmin.

The circuit 5 would only be operative in the presence of a programming voltage Vpp higher than a predetermined minimum value Vppmin. Under this condition (Vpp>Vppmin), the signal LowVcc would be brought to a "high" logic value upon the supply voltage Vcc dropping below the minimum threshold Vccmin.

Figure 2:
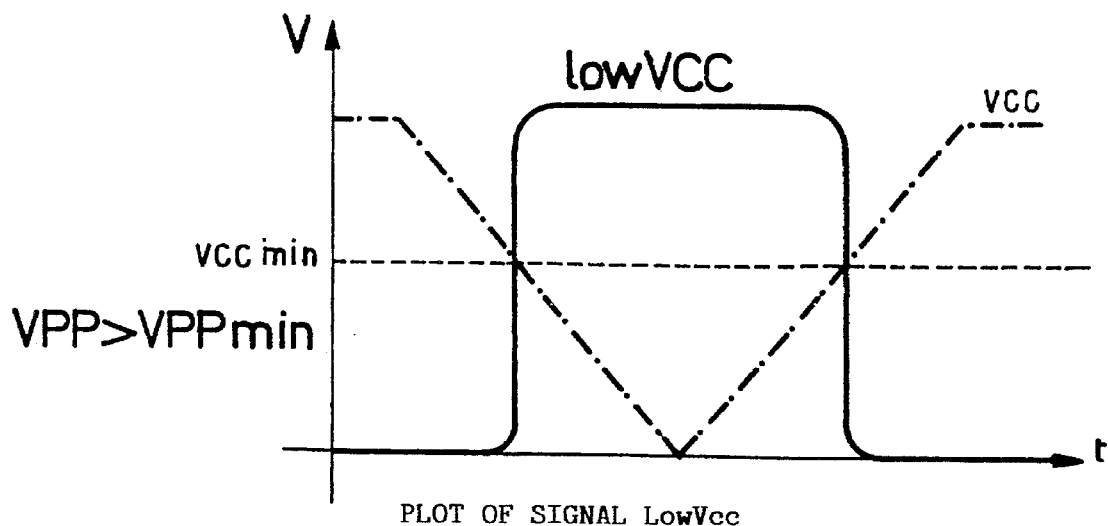
FIGS. 2 and 3 illustrate a voltage vs. time pattern of a set of electric signals present in the device shown in FIG. 1.

The signal LowVcc, in relation to the threshold value Vccmin, is illustrated by the graph of FIG. 2.

Also provided is a circuit 7 generating a reset logic signal POR (Power On Reset). The circuit 7 is supplied the supply voltage Vcc, and is also operative in the absence of the programming voltage Vpp. It plays its most important role as the device 1 is turned on.

Figure 3:
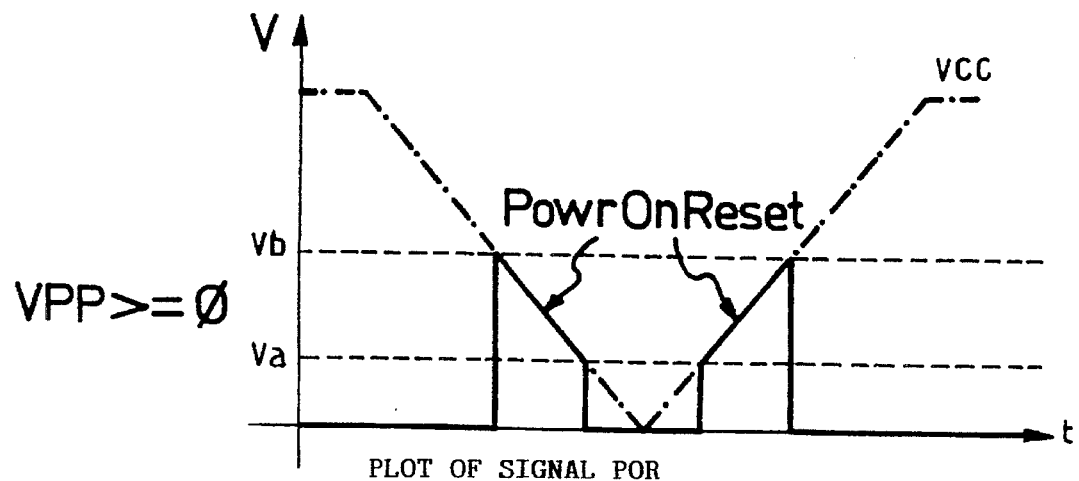

The signal POR is passed to an output 8 of the circuit 7, and during the power-on or power-off transient it essentially tracks the value of the supply voltage Vcc while the voltage Vcc occurs between two predetermined values Va and Vb, the latter limit lying below the minimum threshold Vccmin. The signal POR, in relation to the predetermined values Va and Vb, is illustrated by the graph of FIG. 3. In a preferred embodiment of the present invention, the circuit I comprises a logic gate 10 having two inputs 9, 11 and an output 12. In the preferred embodiment illustrated, the logic gate 10 is of the OR type. The inputs 9 and 11 of said logic gate 10 are respectively connected to the output 6 of the circuit 5 and the output 8 of the circuit 7. As a result, the first input 9 of the gate 10 will be applied the logic LowVcc, whilst the second input 11 will be applied the logic signal POR. The output 12 of the logic gate 10 supplies a reset signal which is determined by the logical sum of the input signals and applied to the control logic 3.

The method of this invention for generating the reset signal will now be described.

As already brought out by the foregoing description, a preferred method of this invention provides for application of the reset signal to the control logic 3 as a function of the change-over between the output signal from the threshold detector 5 and the signal POR generated by the circuit 7 during the power-on transient of the device 1. In particular, the change-over function is a logical sum (OR).

The reset signal at the output of the logic gate 10 behaves like the signal LowVcc in the presence of programming voltage Vpp (of course, only if Vccmin is greater than Vb), and is logic "high" if the pattern of the signal POR is within Va and Vb in the absence of programming voltage Vpp.

Thus, when the circuit I is turned on, and absent the programming voltage Vpp, the whole logic circuitry 3 of the circuit 1 is held to a reset state for as long as the value of the supply voltage Vcc is held between Va and Vb. Thus, the whole circuitry will exhibit a logic state as defined before the operation is started, thereby overcoming the prior art problems previously pointed out.

The values of the threshold voltages Va and Vb used in the circuit are selected to meet the requirements for proper operation of the storage circuit. For example, the OR gate 10 is designed so that, for the selected voltage between Va and Vb, it outputs a reset signal to provide the reset function. (Alternatively, one may say that Va is selected in conjunction with the OR gate 10 to output a reset signal if the input at 11 is above Va.)

For instance, the threshold value Vb is selected to be lower than Vccmin but in all cases equal to a voltage whereby the entire logic of the device is expected to perform satisfactorily.

In a storage circuit provided with a PWD (Deep Power Down) terminal, this terminal would just serve the single function of lowering the device consumption. It would not be used for resetting the logic circuit 3. Thus, by virtue of the invention, a user having no need of lowering the device low consumption may connect the PWD terminal directly to ground. This connection makes for more convenient management of the device.

The detailed description provided above will enable those skilled in the art to make various modifications to the preferred embodiment that do not depart from the spirit and the scope of the present invention. As such, the present invention encompasses all such modifications that read on the appended claims and equivalents thereof.

We claim:

1. A circuit for generating a master reset signal for an electrically programmable non-volatile storage device having a matrix of memory cells and having a control logic portion that receives a supply voltage and a programming voltage, the circuit comprising:

a threshold detection circuit that is coupled to receive said supply and programming voltages, said threshold detection circuit operable to generate a low-supply signal when said supply voltage is less than a first predetermined value and said programming voltage is greater than a second predetermined value;

a power-on circuit coupled to receive said supply voltage and operable to generate a power-on-reset signal when said supply voltage is less than a third predetermined value; and a logic gate coupled to receive said low-supply and power-on-reset signals and coupled to said control logic portion, said logic gate operable to generate and to provide to said control logic portion said master reset signal.

2. The circuit of claim 1, wherein:

said third predetermined value is less than said first predetermined value; and said power-on-reset signal equals said supply voltage when said supply voltage is between said third predetermined value and a fourth predetermined value that is less than said third predetermined value.

3. A method for generating a master reset signal for an electrically programmable non-volatile storage device that includes a matrix of memory cells and a control logic portion that receives a supply voltage and a programming voltage, the method comprising:

generating a low-supply signal whenever said supply voltage is below a first predetermined level and said programming voltage is above a second predetermined level;

generating a power-on-reset signal whenever said supply voltage is below a third predetermined level; and logically combining said low-supply and power-on-reset signals to generate said master reset signal.

4. The method of claim 3 wherein said third predetermined level is less than said first predetermined level.

5. The method of claim 3 wherein said generating a power-on-reset signal comprises generating said power-on-reset signal when said supply voltage is less than said third predetermined level and is greater than a fourth predetermined level, said third predetermined level greater than said fourth predetermined level.

6. A method for ensuring data integrity of memory elements of a storage device that is coupled to a control logic, the method comprising:

providing a supply voltage and a programming voltage to said control logic; and automatically providing a reset signal to said control logic to inhibit any erasing and any writing of said memory elements of said storage device while said supply voltage is less than a first threshold value, or while said supply voltage is less than a second threshold value that is greater than said first threshold value and said programming voltage is greater than a minimum programming value.

7. The method of claim 6, wherein said automatically providing comprises automatically providing said reset signal to said control logic to inhibit any erasing and any writing of said memory elements of said storage device while said supply voltage is less than said first threshold value and is greater than a third threshold value that is less than said first threshold value, or while said supply voltage is less than said second threshold value and said programming voltage is greater than a minimum programming value.

8. A circuit according to claim 1, wherein said logic gate is an OR gate.

9. A circuit according to claim 1, wherein said power-on circuit lacks a connection to said programming voltage.

10. A circuit according to claim 1, wherein said power-on reset signal equals said supply voltage when said supply voltage is between said third predetermined value and a fourth predetermined value that is less than said third predetermined value.

11. A circuit according to claim 10, wherein said third predetermined value is less than said first predetermined value.

12. A method according to claim 3, wherein said logical combining comprises ORing together said low-supply and power-on-reset signals.

13. A method according to claim 3, wherein said generating a power-on-reset signal comprises generating said power-on-reset signal regardless of the level of said programming voltage.

14. The method of claim 6, further comprising:

inhibiting said providing of said reset signal while said programming voltage is less than said minimum programming value and said supply voltage is less than a third threshold value that is less than said first threshold value.

* * * * *